United States Patent [19]

Tripp et al.

[11] 4,420,878

[45] Dec. 20, 1983

[54] INSERTION HEAD FOR DIP AND DIP SOCKET COMPONENTS

[75] Inventors: James W. Tripp, Whitney Point; John Schoenmaker, Greene, both of N.Y.

[73] Assignee: Universal Instruments Corporation, Binghamton, N.Y.

[21] Appl. No.: 351,416

[22] Filed: Feb. 23, 1982

[51] Int. Cl.³ .............................................. H05K 3/30
[52] U.S. Cl. ...................................... 29/741; 29/566.3
[58] Field of Search ...................... 29/741, 740, 566.3, 29/759, 566.4, 837–839

[56] References Cited

U.S. PATENT DOCUMENTS

| 4,030,180 | 6/1977 | Pierson | 29/741 |
| 4,286,380 | 9/1981 | Blount | 29/741 |
| 4,327,483 | 5/1982 | Zemek et al. | 29/741 |

Primary Examiner—Carl E. Hall
Attorney, Agent, or Firm—Fidelman, Wolffe & Waldron

[57] ABSTRACT

An apparatus having primary and secondary camming surfaces for controlling the opening and closing of guide jaws of an insertion head, such that a greater population density of a circuit board with electronic components is achieved.

4 Claims, 13 Drawing Figures

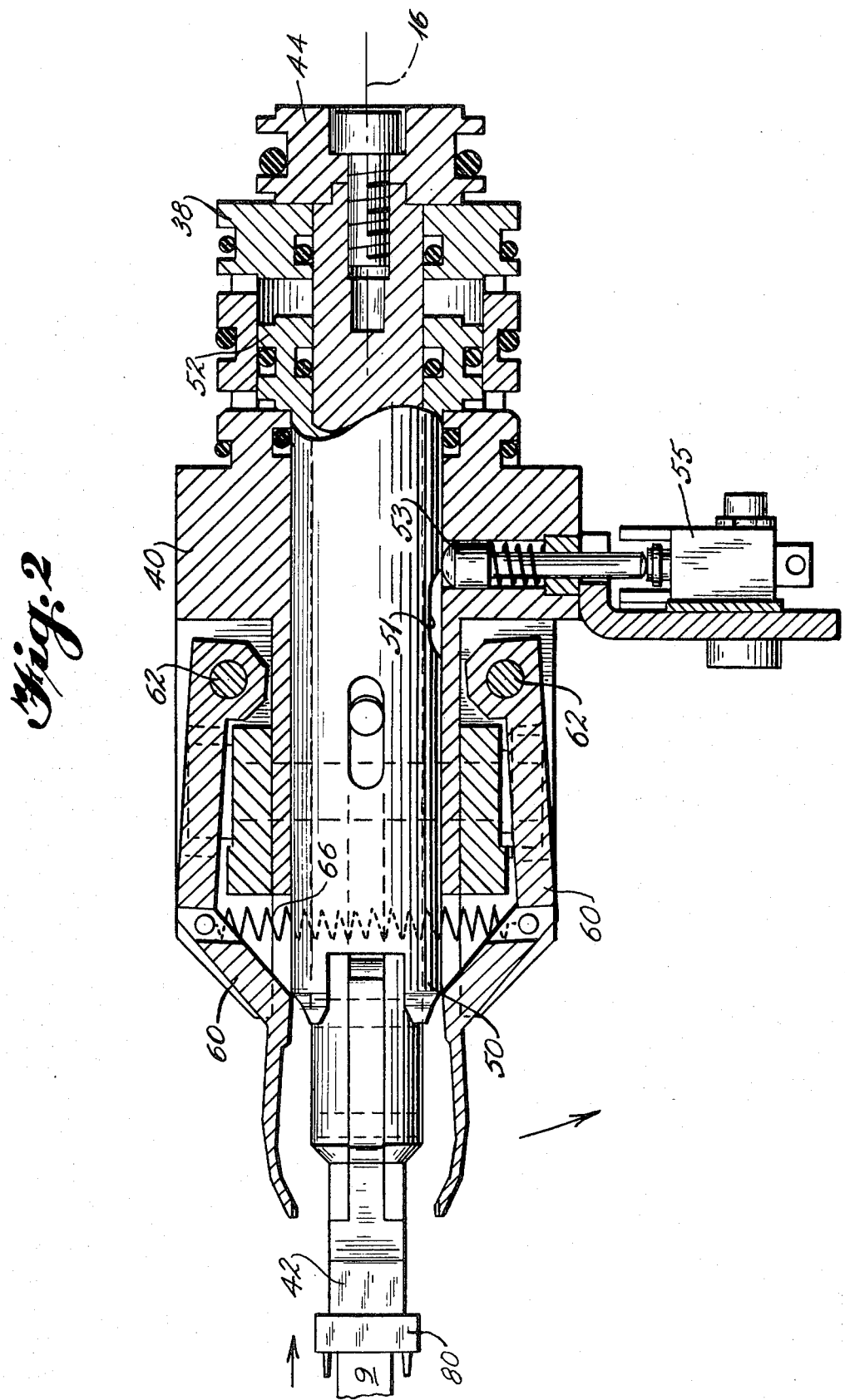

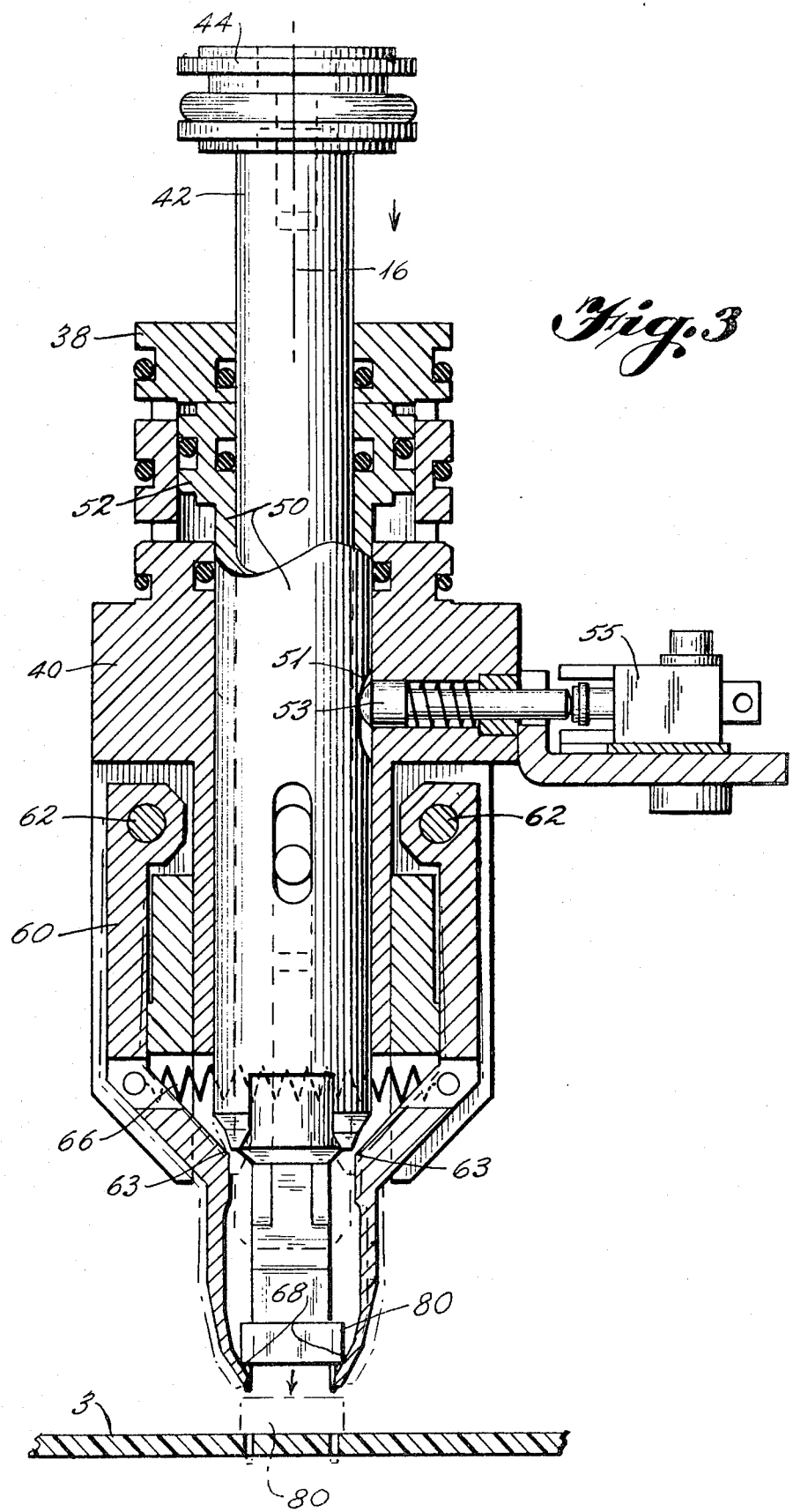

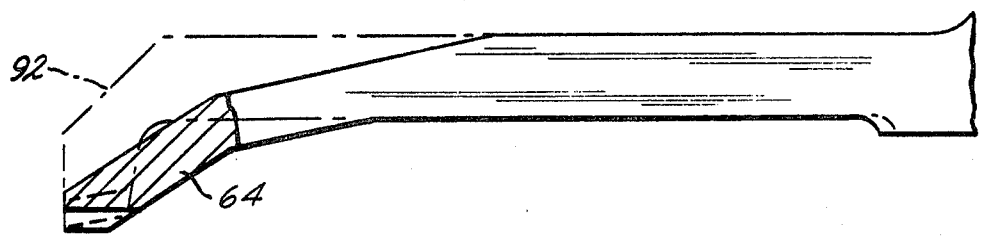
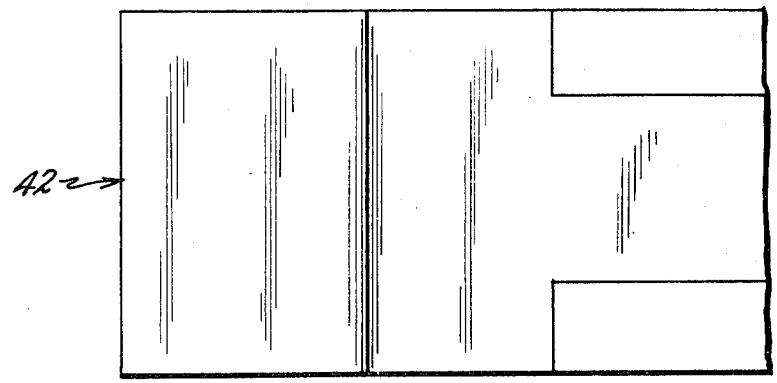
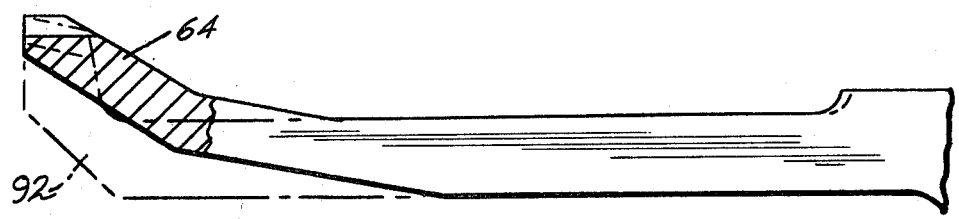
Fig. 10
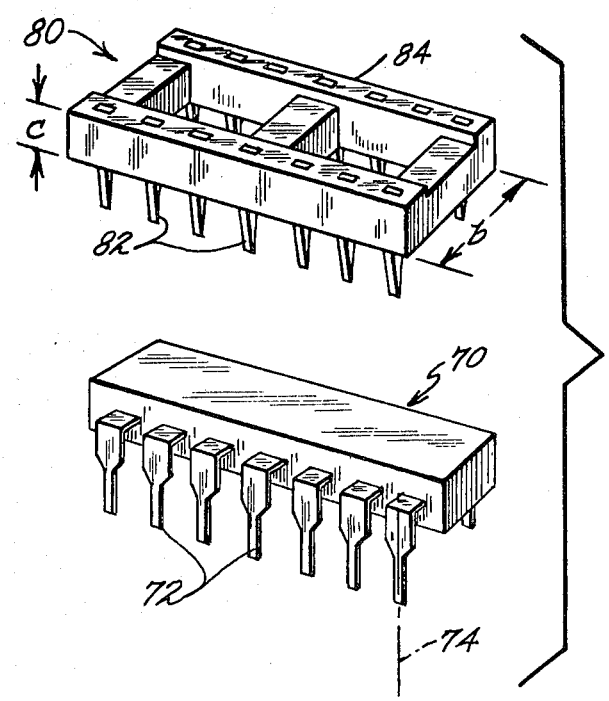
Fig. 8

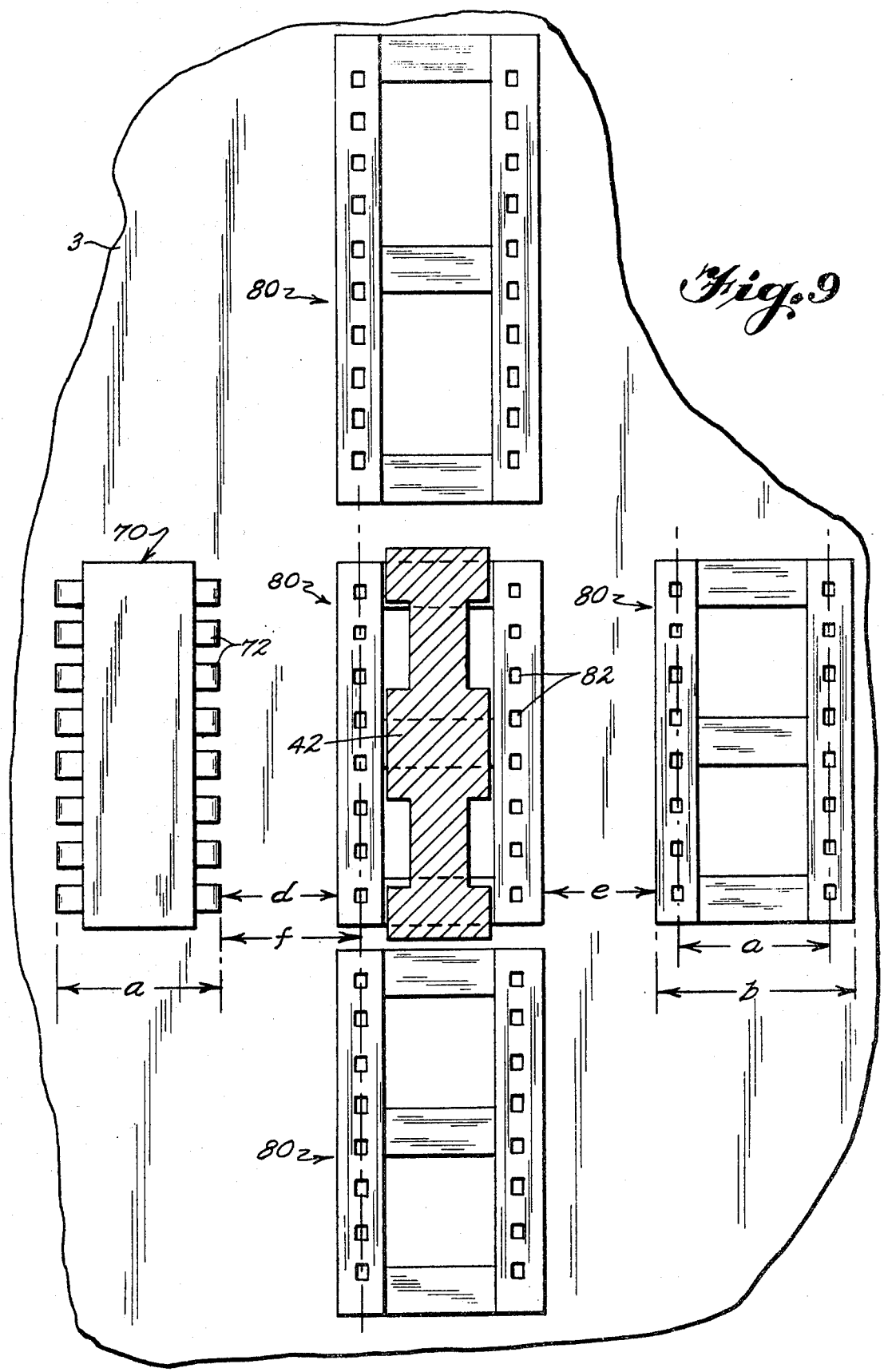

INSERTION HEAD FOR DIP AND DIP SOCKET COMPONENTS

BACKGROUND AND SUMMARY OF THE INVENTION

The instant invention is directed to insertion of intermixed DIP and DIP socket components (hereinafter, DIP sockets are referred to as sockets) by an apparatus which allows closer lateral spacing of these components than has been possible heretofore with high speed, automated, assembly-line types of equipment. In order to accomplish this denser circuit board population, the insert head should be capable of easy loading with a DIP or the wider-bodied socket and, as is sometimes the case, of inserting the DIP or socket into a circuit board location already surrounded by other components, while not interfering with or damaging these surrounding components. This has been accomplished in the apparatus of the instant invention by providing an improved mechanism for controlling the opening and closing of the lead engaging and guiding jaws of an insertion head similar to that disclosed in U.S. Pat. No. 4,030,180, issued to Pierson on June 21, 1977.

In the population of circuit boards, with an intermixing of DIP and socket components, and in the context of this invention, several dimensions are of particular importance. For instance, lead center distance—the spacing between the axes of opposed leads of rows of leads for an individual DIP or socket; socket body width; socket body height; the lateral spacing dimension between the leads of a DIP and the side surface of an adjacent socket; and the lateral spacing dimension between side surfaces of adjacent sockets. It should be noted that the spacing dimension between rows of holes for adjacent components is generally a fixed distance in order to allow flexibility in board design, i.e., selection of either a DIP or socket for insertion at a particular position on the circuit board and, in order to increase the intermixed population of components on a circuit board, it is desirable to minimize this dimension. A better understanding of these dimensions may be gained by referring to the drawings and their associated description.

It is therefore an object of the present invention to provide an improved component insertion head which will allow closer or denser population of electronic components on a circuit board.

It is another object of the present invention to provide a component insertion head that can insert DIPs and DIP sockets in an intermixed relation upon a circuit board and in a dense population thereof.

It is another object of this invention to provide full opening of guide jaws of the insertion head during loading thereof with a DIP or DIP socket, and partial opening and controlled closing thereof during insertion of the DIP or DIP socket into a circuit board.

Other objects of the invention will, in part, be obvious and will, in part, appear hereinafter.

The improved mechanism of this invention comprises primary and secondary cam surfaces, engageable with component gripping jaws by variable shifting of a camming tube according to a programmed high or low fluid pressure supply, to open and control closing of the jaws in opposition to tension spring-biasing of the jaws toward a closed position onto the component leads. The mechanism of this invention further comprises improved component engaging jaw ends which provide support for component leads through an increase lead contacting and guiding surface and a reduced "footprint", indicative of the circuit board surface area between adjacent components that is needed for proper functioning of these jaws.

BRIEF DESCRIPTION OF THE DRAWINGS

FIGS. 2 and 3 are sectional views through the head tooling assembly of the insert head of FIG. 1 while in the horizontal and vertical positions, respectively.

FIG. 8 is an isometric of a DIP and DIP socket.

FIG. 9 is a top plan view of a circuit board during insertion of a DIP socket.

FIG. 10 is an enlarged view of the guide jaws, with the prior art guide jaws shown in phantom.

DETAILED DESCRIPTION OF THE INVENTION

In the population of circuit boards, with an intermixing of DIP and socket components, and in the context of this invention, several dimensions are of particular importance. For instance, FIGS. 8 and 9 illustrate: lead center distance "a"—the spacing between the axes of opposed leads of rows of leads for an individual DIP or socket; socket body width "b"; and socket body height "c". FIG. 9 is a partial top plan view of a circuit board populated with an intermixing of DIP and socket components and illustrates: the lateral spacing dimension "d" between the leads of a DIP and the side surface of an adjacent socket; and lateral spacing dimension "e" between side surfaces of adjacent sockets. It should be noted that the spacing dimension "f" between rows of holes for adjacent components is generally a fixed distance in order to allow flexibility in board design, i.e., selection of either a DIP or socket for insertion at a particular position on the circuit board; in order to increase the intermixed population of components on a circuit board, it is desirable to minimize spacing dimension "f".

Figure 1:
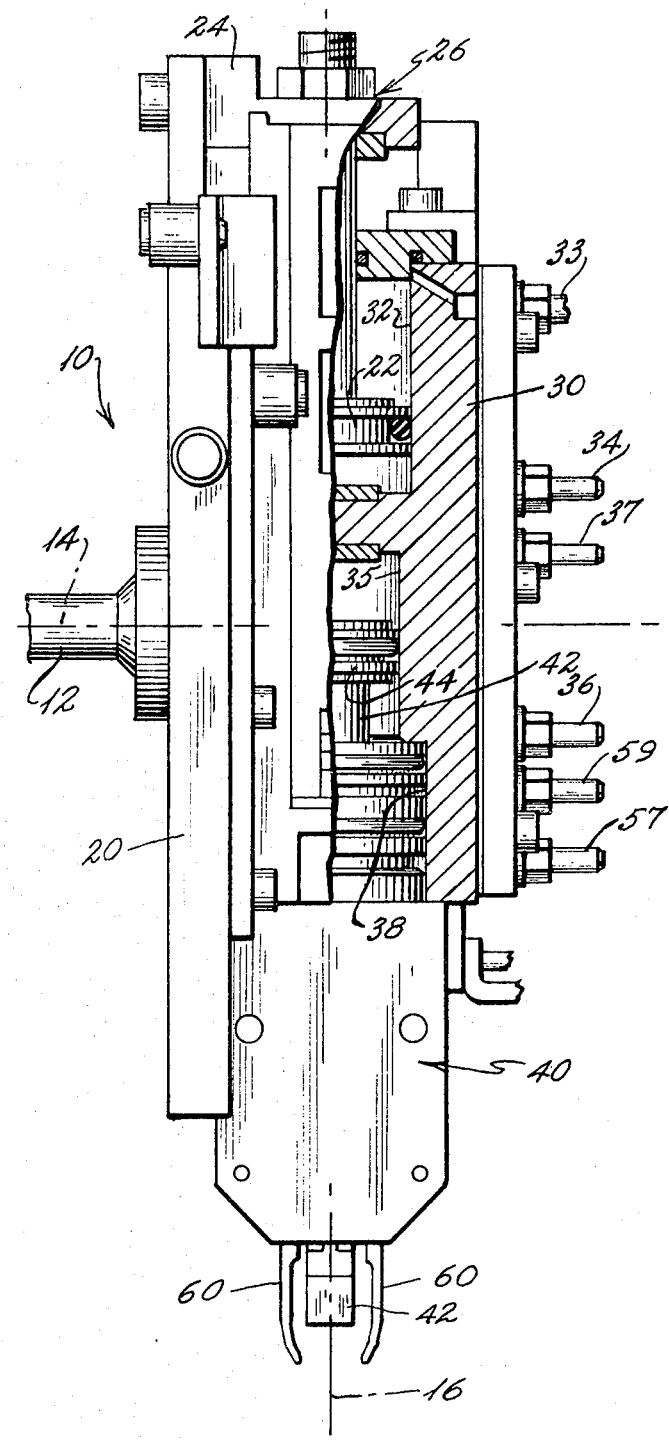
FIG. 1 is a side elevation, partially in section, of an insert head incorporating the instant invention.
Figure 11:
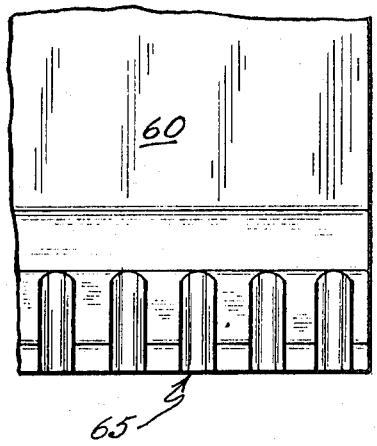
FIG. 11 is a partial, enlarged plan view of the guide jaw combs, as viewed along arrows 11—11 of FIG. 4.
Figure 4:
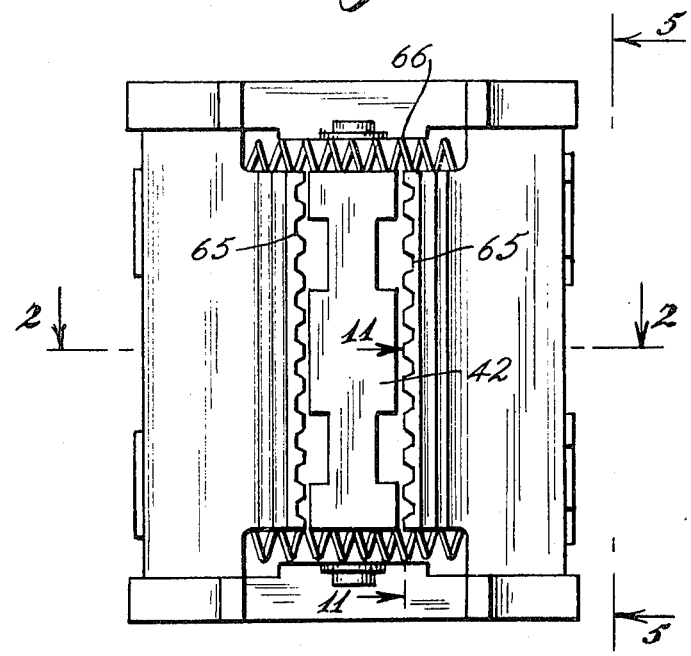
FIG. 4 is a plan view looking into the jaws of the insert tooling along arrows 4—4 of FIG. 1.
Figure 5:
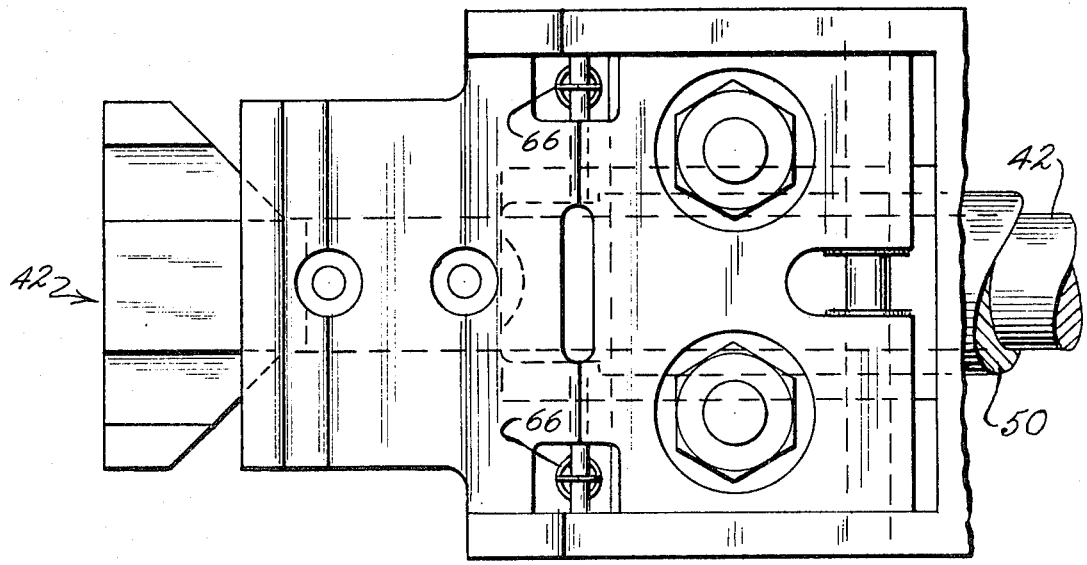
FIG. 5 is a partial side elevation of the component engaging end of the head tooling, as indicated by arrows 5—5 of FIG. 4.

FIG. 1 discloses an electronic component insertion head 10 which is similar to that of U.S. Pat. No. 4,030,180. Insertion head 10 is mounted to a support (not shown) by support rod 12 for rotation about axis 14 between the horizontal positions of FIGS. 1 and 2. Slide plate 20 is attached to rotation support rod 12 and includes a generally L-shaped bracket 24 to which slide piston 22 is affixed, as by a threaded connection at 26. Cylinder assembly 30 comprises a slide cylinder 32 into which slide piston 22 telescopes, such that slide cylinder 30 may reciprocate along the longitudinal axis 16, while being guided by slide plate 20. Fluid connections 33 and 34 of slide cylinder 30 provide, respectively, retraction and extension fluid supply connection to cylinder 32.

Figure 6:
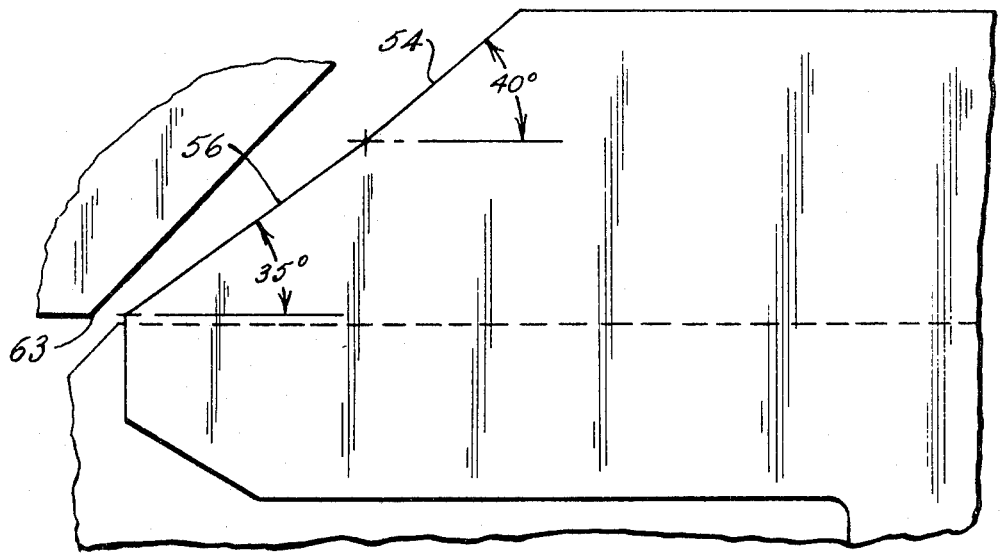
FIG. 6 is an enlarged view illustrating the primary and secondary cam surfaces.

Cylinder assembly 30 sealingly receives head tooling assembly 40, as indicated by numeral 38. Tooling assembly 40 may be seen in greater detail in FIGS. 2 and 3. Cylinder assembly 30 further comprises a pusher cylinder 35 for receiving pusher piston 44, with the retraction and extension of fluid supply provided, respectively, by fluid connections 36 and 37. Pivotally attached to head tooling 40 at 62 are a pair of guide jaws 60, the free ends of which are biased toward each other by tension spring 66. Separately extensible and retractable, along longitudinal axis 16 and relative to each other and to slide plate 20, are a pusher rod 42 and a camming tube 50. Each side of camming tube 50 has a primary camming surface 54 and secondary camming surface 56 (as best seen in the enlarged view of FIG. 6) for cooperating with the guide jaw 60 corresponding to that side. Fluid connections 57 and 59 (of FIG. 1) provide, respectively, retraction and extension pressure to cam cylinder 58.

A typical device for loading DIP and socket components into the insert head 10, and the general working relationship therebetween, is the spreader/platform assembly illustrated in U.S. Pat. No. 4,030,180. This loading device includes a reciprocatable platform (a portion of which is shown at 9 in FIG. 2) for engaging the bottom of a DIP 70 or socket 80 which has been supplied thereto as by a gravity chute. Spreader arms of this loading device have contacts for engaging the leads 72 of a DIP for slight spreading and for testing the electronic characteristics of the DIP 70 prior to loading into insert head 10. DIP sockets 80 have generally stronger leads 82 which, preferably, are not spread prior to loading of insert head 10, although it may be desirable to make contact with leads 82 to ascertain that none are missing or badly deformed. During loading of insert head 10, pusher 42 is extended to engage the top of the component so that the component is captured between the loading platform 9 and pusher 42. Thereafter, loading platform 9 extends, and pusher 42 retracts to carry the captured component into the jaws 60 of insert head 10.

Figure 7:
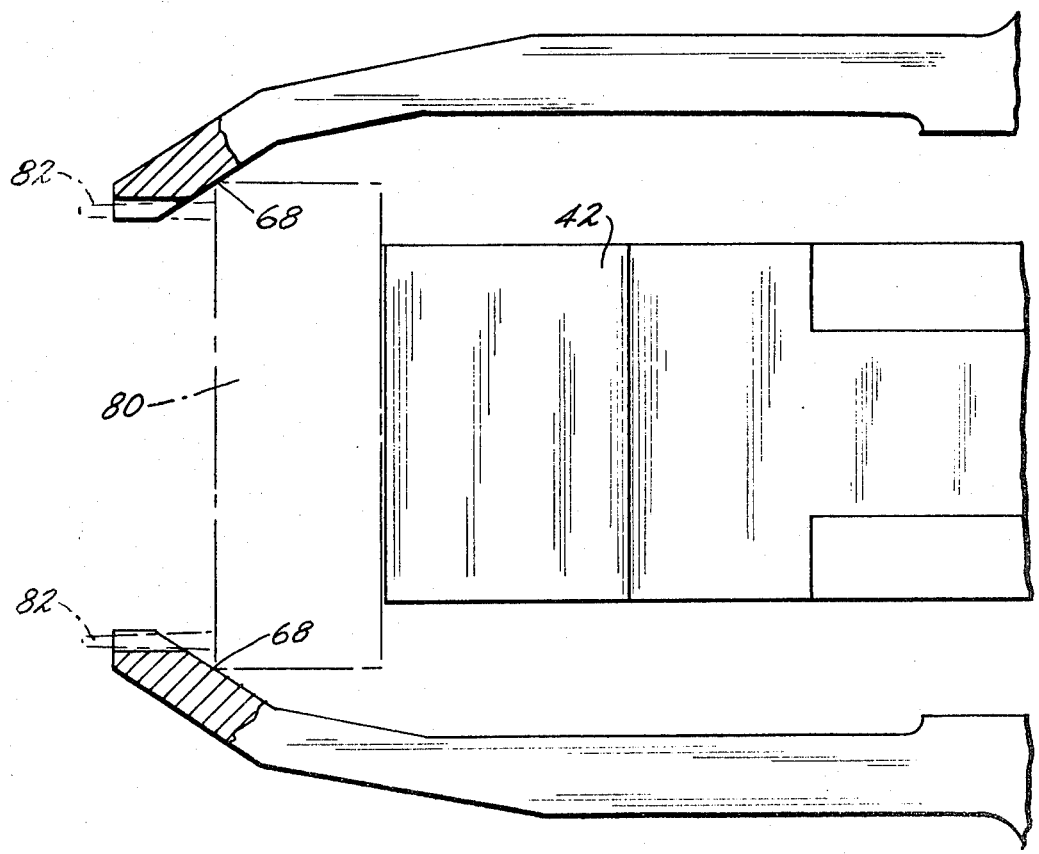
FIG. 7 is an enlarged view of the guide jaws and pusher during insertion of a DIP socket.

Since it is an object of this invention to increase the population of a circuit board 3 by allowing closer lateral spacing of DIPs 70 and DIP sockets 80, the free ends 64 of guide jaws 60 have been improved over the prior art guide jaw free ends 92 (as seen in FIG. 10) such that the new angled portion 68 of each guide jaw 60 is engageable with the body of a socket 80 during the insertion operation. It has been found that the gradual angling of portions 68 also provides guiding surface contact of guide jaw combs 65 over a greater length of DIP leads 72 (as may be appreciated by reference to FIG. 7) during insertion, and a realized increase in DIP insertion reliability is thought to be due to this increased guiding surface contact. Further, a decrease in damage of DIP socket stand-offs (portions of the DIP socket that space the body proper from the circuit board) has been realized and is thought to be due to the improved guide jaws 60.

OPERATION

A switch, not shown, is actuated upon rotation of insert head 10 to the horizontal position of Figure 2, such that high fluid pressure is available, although not yet applied, to cam tube piston 52. Head tooling assembly 40, pusher rod 42, and cam tube 50 are in their retracted positions during rotation of insert head 10 to avoid interference with any other parts of the automated equipment. Having attained this horizontal position, head tooling assembly 40 is extended close to the spreader/platform assembly loading device and, simultaneously, pusher rod 42 is extended into engagement with the top of the component so that it is captured between pusher 42 and the platform 9 of the loader. Full or high pressure (approximately 80 PSI) is then applied to cam tube piston 52 so that primary cam surface 54 (nominally at an angle of 40° to longitudinal axis 16) forces jaws 60 fully open. Prior to closing of jaws 60 from this fully opened position, a DIP or socket may be loaded into head 10 without contacting the jaws. As described earlier, this loading is accomplished by extension of the loader platform 9 during retraction of pusher 42, with a component captured between pusher 42 and the platform 9. Next, cam tube 50 is retracted and spring 66 biases jaws 60 to a closed position onto the leads of the component such that the leads protrude beyond the free ends of the jaws 60 (nominally 0.020 inches). If the leads 72 of a DIP 70 are bent relative to the lead axis 74, the guide combs 65 of the jaws 60 will tend to straighten them. Further, since the leads 72 of a DIP 70 have been forced slightly outward by the spreader of the loading device, they are now forced slightly inward by the spring biased guide jaws 60 to a preferred lead center distance, for instance, 0.300 inches.

After loading is accomplished, and according to a programmed control, head tooling assembly 40 is retracted for rotation of head 10 to the vertical position of FIGS. 1 or 3. The earlier mentioned switch (not shown) is actuated when head 10 reaches the vertical position and the pressure available to cam piston 52 is changed from high to low (nominally 30 PSI), but cam tube 50 is not fired yet. Head tooling 40 is now extended to approach the circuit board (nominally, within 0.004 inches thereof) so that the component leads are started into the circuit board holes.

Attached to head tooling assembly 40 is a switch 55 which is actuated by a spring-biased switch actuator 53 extending into the body of the head tooling assembly and engageable with a notch 51 in cam tube 50. The purpose of this switch is to indicate, when actuator 53 is not received in notch 51, that jaws 60 are open.

In order to provide a complete description of the insertion of the two different components, the remaining steps of the operation are separated for DIPs and sockets.

DIP Insertion

With the leads 72 of a DIP 70 already started into the circuit board holes, pusher 42 is fired to continue insertion until the bottom of the DIP 70 is flush with the circuit board. According to body fragility, and in order that components of different body heights "c" may be accommodated, the fluid pressure source for pusher piston 44 is settable. One such pressure setting is 40 PSI. Slightly later (nominally 49.8 milliseconds later), cam tube piston 52 is actuated by the low pressure source so that guide jaws 60 are opened just sufficiently to clear the DIP leads 72. Due to the biasing of the spring 66 and to low (rather than high) pressure applied, cam tube 50 is limited in its extension such that only secondary cam surfaces 56 (nominally at an angle of 35° to longitudinal axis 16) engage jaws 60, with relative sliding movement between secondary cam surfaces 56 and jaw portions 63 occurring until the transition point between the primary and secondary cam surfaces is almost reached. Thus, jaws 60 are opened only partially 30 that the (already inserted) components on either side of the DIP 70 that is being inserted may be positioned together more closely.

With the DIP 70 inserted and jaws 60 opened partially, head tooling 40 is retracted while pusher 42 remains in contact with the top of DIP 70. Head tooling 40 carries cam tube 50 with it during this retraction so that jaws 60 retain their partially open position. The full retraction of head tooling 40 is sensed, pusher 42 is retracted, and the insert head rotates back to the horizontal position to begin another cycle.

DIP Socket Insertion

With the leads 82 of a socket 80 started into the circuit board holes, pusher 42 is fired to continue insertion of the leads 82 so that socket standoffs are flush with the circuit board 3. Because the socket body 80 is wider than lead center distance "a" (the maximum width of a DIP), guide jaws 60 are contacted and forced to follow the contour of the socket 80 against the biasing of spring 66 during extension of pusher 42. Slightly later (nominally 49.8 milliseconds later) cam tube piston 52 is actuated by the low pressure source. Since jaws 60 are in contact with the side surfaces 84 of socket 80, they are spaced slightly wider than lead center distance "a". Hence, with the same amount of low pressure (e.g., 30 PSI) applied for socket insertion as for DIP insertion, cam tube 50 travels further before engaging jaw portions 63, such that jaw portions 63 and cam tube 50 engage on primary cam surface 54, slightly above the transition point between the different cam surfaces. A quiescent point of counterbalancing forces is attained at this time such that, if socket 80 were removed from jaws 60, spring 66 would not cause cam tube 50 to move. Because of this counter-balancing of forces, the compression of the spring biased jaws is relieved enough that they will slide along socket side surfaces 84 during retraction of head tooling 40. So, while pusher 42 remains in contact with the top of socket 80, head tooling 40 is retracted and guide jaws 60, retaining a partially open spacing slightly greater than for a DIP, slide along socket side surfaces 84 and clear the socket 80. Full retraction of head tooling 40 is then sensed, pusher 42 is retracted, and insert head 10 is rotated back to the horizontal position for starting another cycle.

Figure 12:
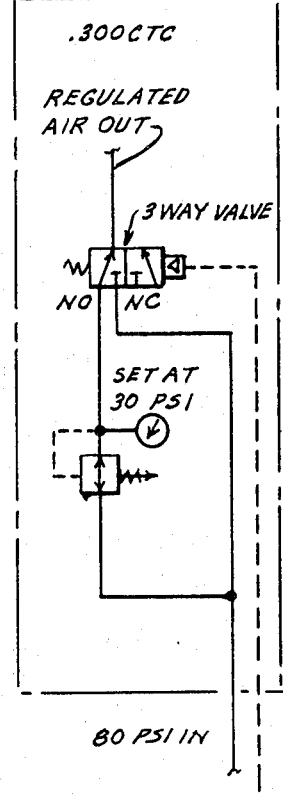
FIGS. 12 and 12a are schematics of the fluid supply for the insert head.
Figure 12A:
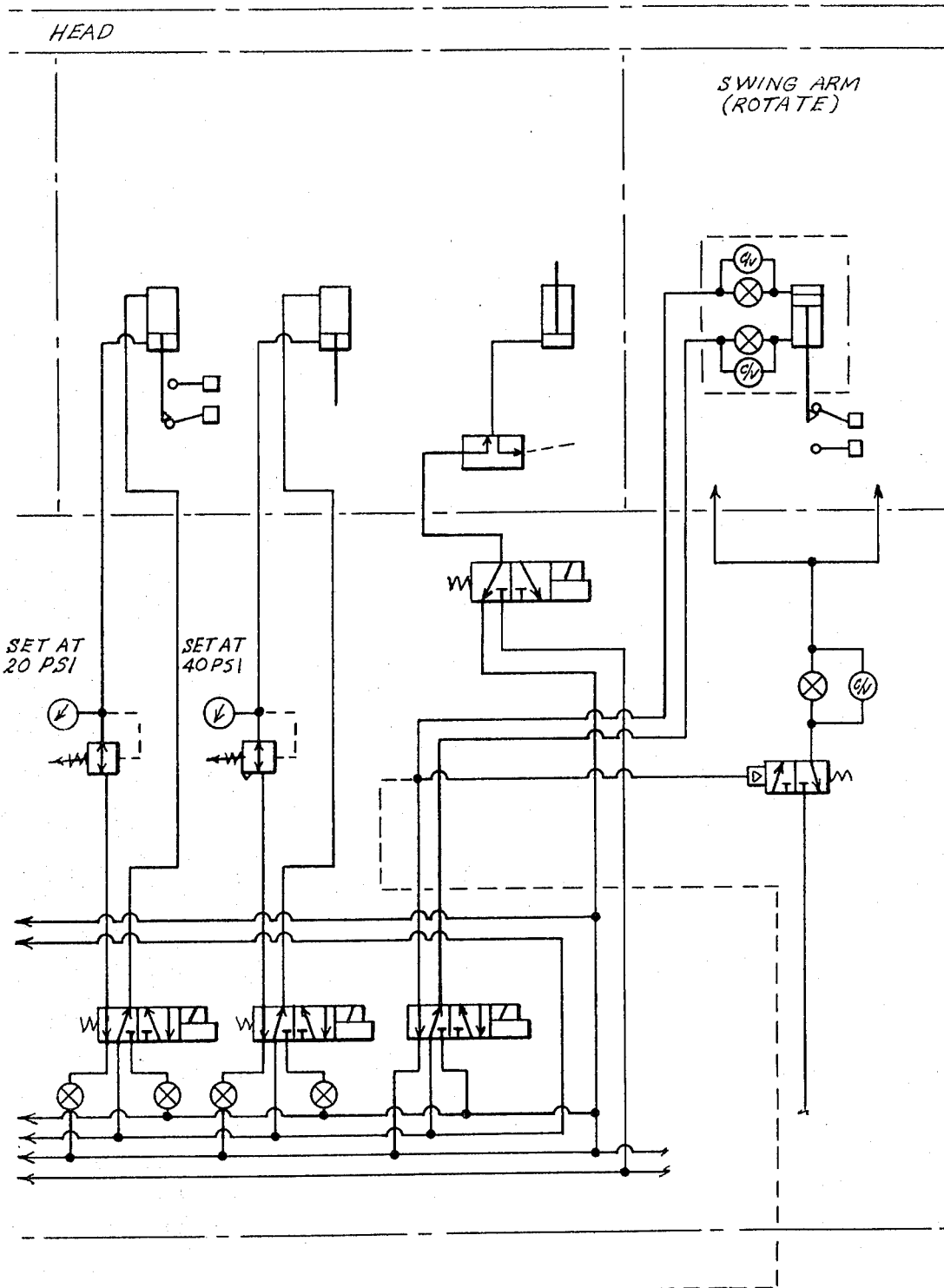

The fluid control diagram for the instant invention is shown in FIGS. 12 and 12a.

As may be appreciated by reference to the drawings and the above description of the operation, the improved guide jaws may be used in the insertion of DIPs and DIP sockets wherein controlled opening and closing of the jaws to a partially opened position allows denser or closer population of the components on a circuit board. The particular structure of the jaws is important, in addition to providing increased support and guiding surfaces for the leads of the components and allowing a more limited clearance between adjacent components, because the angled portions 68 of the jaws allow a DIP socket 80 to spread the jaws during insertion thereof to the exact width, and no more, of the socket body so that the footprint of the insertion device is minimized. Because of the novel means for opening and controlling the closing of the jaws, this minimized jaw spacing is retained during removal of the jaws from the inserted component.

It will thus be seen that the objects set forth above, among those made apparent from the preceding description, are efficiently attained and, since certain changes may be made in the construction set forth without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. An apparatus for picking up DIP and DIP socket components and population of said components in a laterally spaced relation on a circuit board having lead receiving holes, each of said components having a lateral dimension and comprising a body and substantially parallel leads extending generally in a perpendicular direction away from a planar surface of said body said lateral dimension including body width and lead spacing and said DIP socket lateral dimension being greater than said DIP lateral dimension said apparatus comprising:

a tooling head movable toward and away from said circuit board along a longitudinal axis for insertion of said leads in said holes, said head comprising spring-biased guide jaws each pivotally attached at one end and free at the other end, said other end having guide grooves, such that said guide jaws are spring-biased toward a closed position and engageable with said leads to guide said leads during insertion thereof into said holes;

pusher means extensible and retractable relative to said tooling head along said longitudinal axis and engageable with said body;

primary cam means for opening said guide jaw other ends in opposition to said spring biasing to a spacing sufficient to clear said component lateral dimension during said picking up and insertion, and for controlling the rate of biased closure of said grooves onto said leads during reception of said component in said tooling head;

means for controlling the spacing of said guide jaw other ends after insertion of said leads into said holes by opening said guide jaw ends less than said primary cam means such that said laterally spaced relation of adjacent components is minimized; and means for actuating said primary cam means, said pusher means, said movable tooling head, and said spacing controlling means upon command.

2. An apparatus as in claim 1, wherein said spacing controlling means comprises:

secondary cam means for controlling the spacing of said guide jaw other ends.

3. An apparatus as in claim 1, wherein said means for actuating said spacing controlling means and said primary cam means comprises:

a fluid supplied expansible chamber means for moving said primary and secondary cam means along said longitudinal axis a preset amount according to a variable fluid pressure supplied to said expansible chamber.

4. An apparatus as in claim 3, wherein said fluid pressure is varied upon command.

* * * * *